(12) United States Patent
Jayapalan et al.

(10) Patent No.: US 7,067,842 B1
(45) Date of Patent: Jun. 27, 2006

(54) METHOD AND APPARATUS FOR MONITORING PARASITIC INDUCTANCE

(75) Inventors: Jayakannan Jayapalan, San Jose, CA (US); Liping Li, Campbell, CA (US); Yow-Juang Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/779,593

(22) Filed: Feb. 13, 2004

(51) Int. Cl.
*H01L 23/58* (2006.01)

(52) U.S. Cl. ............ 257/48; 257/E21.524; 331/105; 324/765; 324/654

(58) Field of Classification Search ......... 257/48, 257/E21.524; 331/105; 324/500, 537, 750, 324/763, 765, 555, 600, 612, 649, 654, 655, 324/656, 657
See application file for complete search history.

(56) References Cited

U.S. PATENT DOCUMENTS 6,560,567 B1 * 5/2003 Yechuri ................. 703/2

\* cited by examiner

*Primary Examiner*—Nathan J. Flynn
*Assistant Examiner*—Scott R. Wilson
(74) *Attorney, Agent, or Firm*—Morgan, Lewis & Bockius LLP

(57) ABSTRACT

The present invention includes a method and apparatus for measuring a parasitic inductance associated with a portion of an integrated circuit fabricated on a semiconductor substrate. A test chip for measuring the parasitic inductance is fabricated together with the integrated circuit on the semiconductor substrate. The test chip includes an LC oscillator circuit having at least one substructure that resembles the portion of the integrated circuit and at least one varactor having a capacitance adjustable by a control voltage. When the LC oscillator circuit is connected to the control voltage source and the control voltage is at a certain level, an oscillation is generated in the LC oscillator and the frequency of oscillation can be used to determine the parasitic inductance associated with the portion of the integrated circuit.

22 Claims, 14 Drawing Sheets

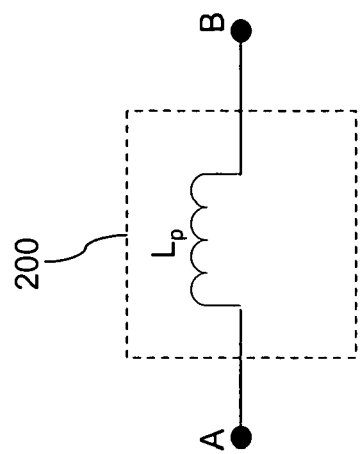
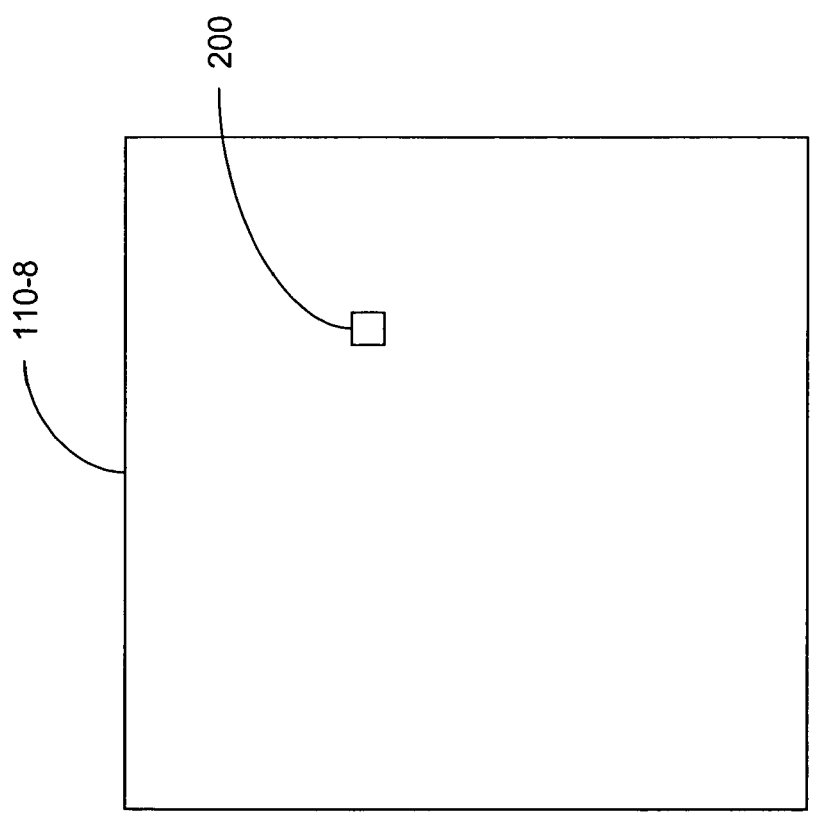

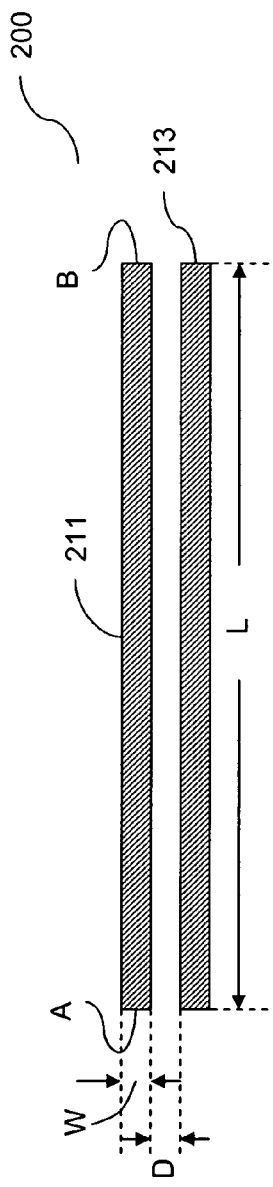
FIG. 2C
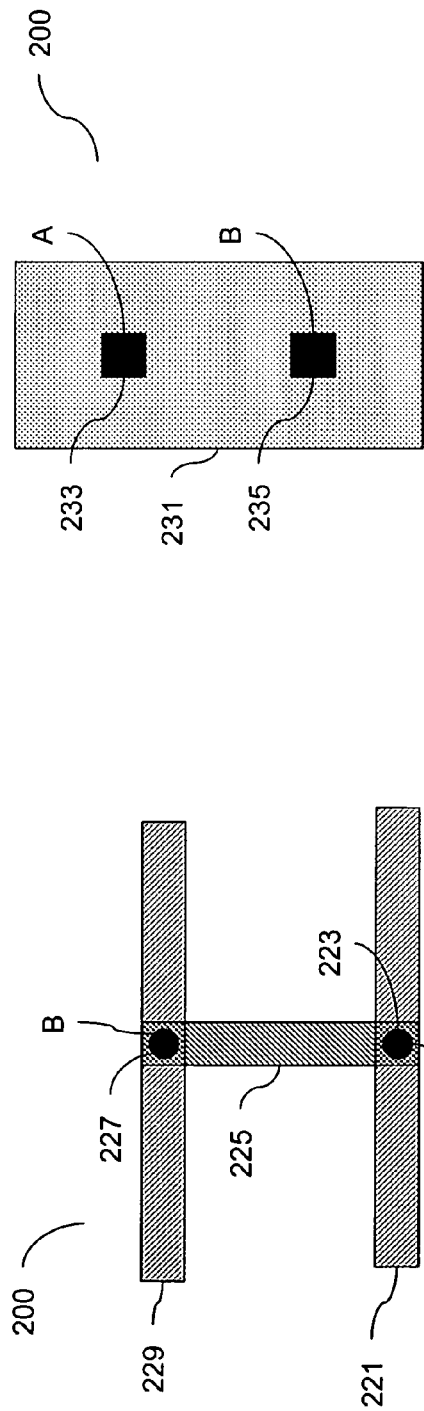
FIG. 2E
FIG. 2D

मेथड AND APPARATUS FOR
MONITORING PARASITIC INDUCTANCE

The present invention relates generally to integrated circuit technologies, and more particularly to measuring parasitic inductance in integrated circuits.

BACKGROUND OF THE INVENTION

Electronic circuit simulators are often used by integrated circuit designers to optimize the design of an integrated circuit (IC). A circuit simulator typically handles the IC in a node/element fashion such that the circuit is regarded as a collection of circuit elements, which are connected at nodes. Common circuit elements include resistors, capacitors, inductors, mutual inductors, diodes, transistors, and interconnect lines, etc. To simulate the IC, each circuit element needs to be properly modeled.

Traditional circuit simulators have ignored parasitic inductance when modeling some of the circuit elements such as interconnect lines in the ICs. The operating frequencies of these ICs were low enough so that induced voltages were generally negligible compared to the effects of parasitic resistance and capacitance in the ICs. With increasing clock speeds and decreasing feature sizes of very large scale integrated circuits (VLSI), interconnect issues, especially variation in signal delays and skews due to parasitic inductance, now play a vital role in the performance of VLSI circuits. In fact, parasitic elements in the interconnects are becoming limiting factors in determining circuit performance. Thus, accurate analysis and careful design of interconnects are of critical importance in realizing quality designs of VLSI circuits, and parasitic inductance is an important factor to be considered when analyzing and designing the interconnects of the VLSI circuits.

To analyze the effects of parasitic resistance (R), capacitance (C), and inductance (L) associated with the interconnects of an IC, the R, C, and L need to be extracted at chip level. Several techniques have been developed to extract the R and C on chip. An example of these techniques has been discussed by Chen, et al. in "An On-Chip, Attofarad Interconnect Charge-based Capacitance Measurement (CBCM) Technique," IEDM 96, 3.4.1. The techniques for on-chip parasitic inductance extraction, however, are less developed. At the moment, there is no commercial tool available for on-chip parasitic inductance measurement. The difficulty of directly measuring the parasitic inductance of interconnect lines arises from the associated small inductance values, the requirement of high frequency instruments, and the difficulty in excluding the capacitance and inductance of contact pads, wires, and probes, etc., which are necessary for connecting the interconnect lines to the high frequency instruments.

SUMMARY OF THE INVENTION

The present invention includes a test structure or test chip for measuring a parasitic inductance associated with a subcircuit in an integrated circuit (IC) fabricated on a semiconductor substrate or wafer. The test chip is formed in a test area of the semiconductor substrate and includes an LC oscillator circuit having at least one varactor with a capacitance adjustable by a control voltage source, and at least one substructure that resembles the subcircuit by including at least one circuit element with a same layout as a circuit element in the subcircuit. When the LC oscillator circuit is connected to the control voltage source and the control voltage is at a certain level, an oscillation is generated in the LC oscillator and the frequency of the oscillation can be used to determine the parasitic inductance associated with the subcircuit.

In one embodiment of the present invention, the LC oscillator circuit includes an LC tank having a pair of varactors and a pair of substructures. The LC oscillator circuit further includes a pair of p-type transistors and a pair of n-type transistors. The p-type transistors and n-type transistors contribute a negative resistance that is tuned to cancel an equivalent parallel resistance of the LC tank.

The present invention further includes a method for measuring the parasitic inductance of the selected subcircuit in the integrated circuit. The method is carried out by connecting the LC oscillator circuit to the control voltage source and adjusting the control voltage source until a stable oscillation is generated in the LC oscillator. The frequency of the oscillation is then measured and is used to determine the inductance associated with each of the pair of substructures, which is used to determine the parasitic inductance associated with the subcircuit in the integrated circuit.

BRIEF DESCRIPTION OF THE DRAWINGS

FIG. 2A is a block diagram illustrating a subcircuit in an IC.

FIG. 2B is a diagram showing a parasitic inductance associated with the subcircuit.

FIGS. 2C–2E are layouts illustrating examples of the subcircuit in the IC.

DETAILED DESCRIPTION

Figure 1:
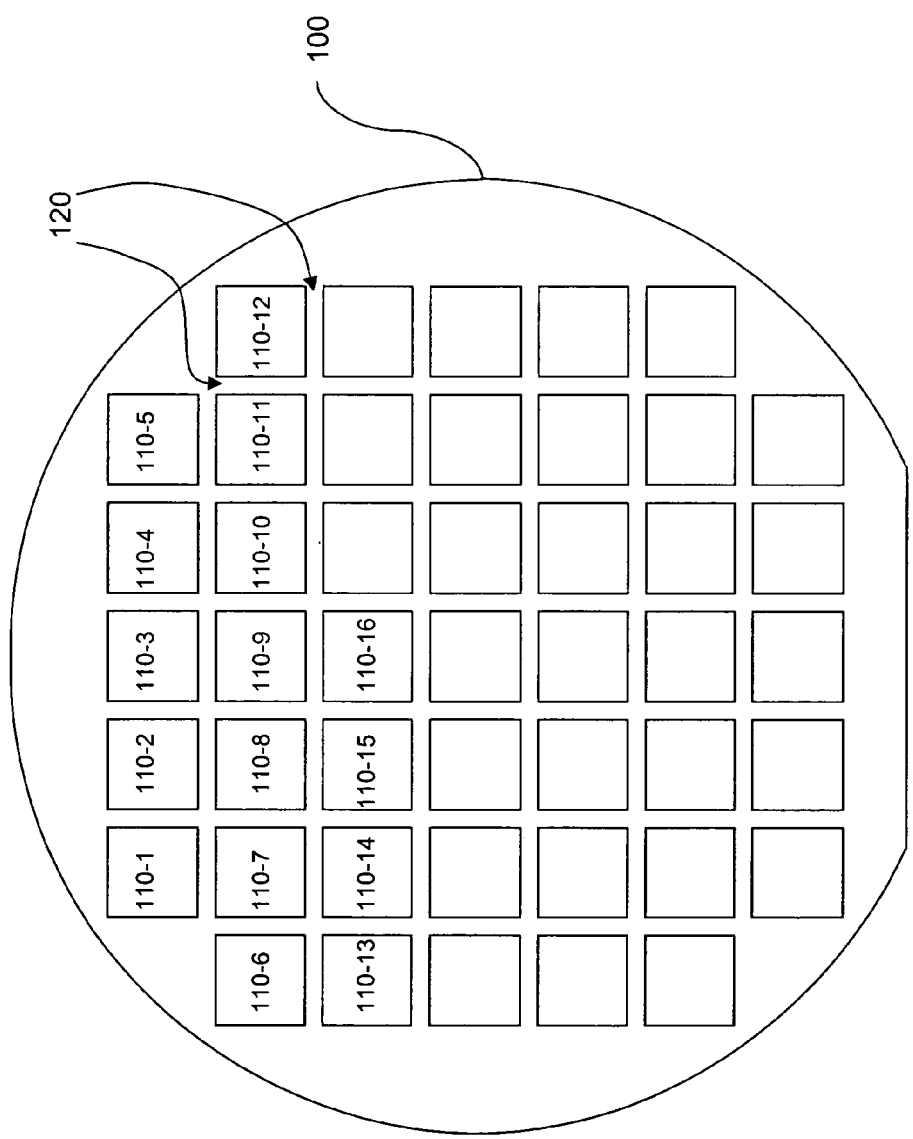
FIG. 1 is a block diagram illustrating a semiconductor wafer having thereon a plurality of ICs separated by test areas.

FIG. 1 illustrates a semiconductor substrate (or wafer) 100 including a plurality of integrated circuits 110-1, 110-2, . . . , 110-8, . . . , 110-16, . . . , and test areas 120 separating the plurality of integrated circuits. FIG. 2A illustrates one of the plurality of integrated circuits, such as integrated circuit (IC) 110-8, which includes a subcircuit 200 having a plurality of terminals at which the subcircuit 200 is connected to other parts of the IC 110-8. The subcircuit 200 includes a parasitic inductance $L_p$ between two of its terminals, terminal A and terminal B, as shown in FIG. 2B. The present invention can be used to determine the parasitic inductance $L_p$.

The subcircuit 200 can be any part of the IC 110-8 having a substantial parasitic inductance $L_p$ that needs to be determined. As one example, the subcircuit 200 may include interconnect lines, as shown in FIG. 2C, which illustrates a layout of two interconnect lines 211 and 213 each having a length L, a width W, and separated from the other by a space D. The terminals A and B of the subcircuit 200 corresponds to two ends of the interconnect line 211. As another example, the subcircuit 200 may include vias, as shown in FIG. 2D, which illustrates a layout of two vias 223 and 227 between an upper interconnect level and a lower interconnect level of the IC 110-8. FIG. 2D also shows an interconnect line 225 connecting the vias 223 and 227 at the lower interconnect level, an interconnect line 221 in contact with the via 223 at the upper interconnect level, and an interconnect line 229 in contact with the via 227 at the upper interconnect level. The terminals A and B of the subcircuit 200 corresponds to top ends of the vias 223 and 227 at the upper interconnect level that are in contact with the interconnect lines 221 and 229. As yet another example, the subcircuit 200 may include diffusion regions, such as source/drain diffusion regions, as shown in FIG. 2E, which illustrates layout of a diffusion region 231 and two contacts 233 and 235 in the diffusion region 231, which corresponds to terminals A and B of the subcircuit 200.

Figure 3:
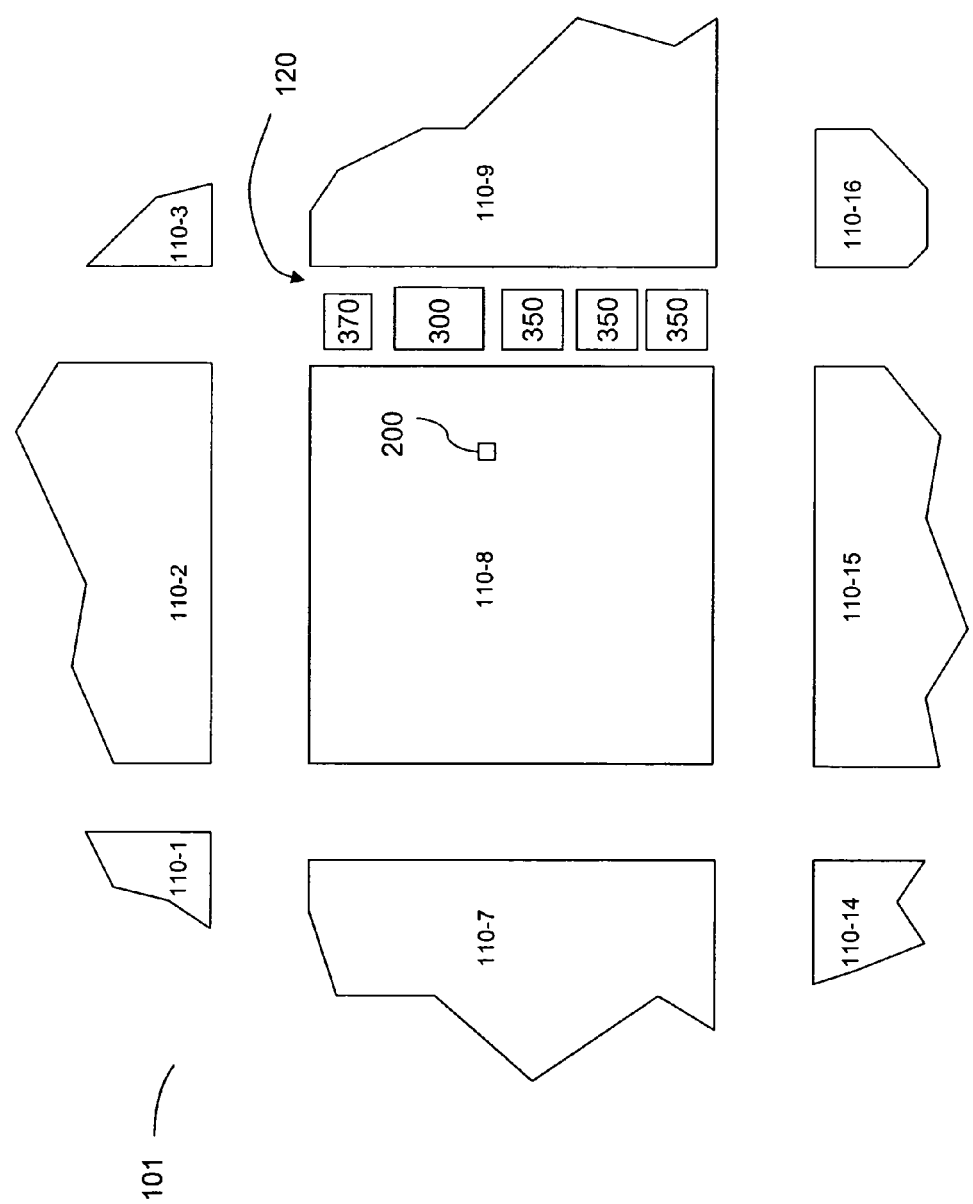
FIG. 3 is a block diagram showing test chips in a test area on the semiconductor wafer according to one embodiment of the present invention.

FIG. 3 illustrates an area 101 of the wafer 100 including integrated circuit 110-8 and portions of neighboring integrated circuits 110-1, 110-2, 110-3, 110-7, 110-9, 110-14, 110-15, and 110-16. FIG. 3 also illustrates a test area 120 between integrated circuits 110-8 and 110-9 and test chips 300, 350 and 370 in the test area. The blocks for the subcircuit 200 and the test chips 300, 350, and 370 shown in the figures are for purposes of illustration and are not to scale with real structures.

Test chip 300 includes an LC oscillator circuit for measuring the parasitic inductance $L_p$ of the subcircuit 200 in the integrated circuit 110-8. FIG. 4 illustrates the LC oscillator circuit 400 in the test chip 300 according to one embodiment of the present invention. As shown in FIG. 4, the LC oscillator circuit 400 includes a test structure 410 between points E and G in the LC oscillator circuit 400, a pad 430 for connecting the LC oscillator circuit to a control voltage source $V_{CONTROL}$, a pair of varactors 420-1 and 420-2 between points H and K in the LC oscillator circuit 400 and having their control terminals connected to the pad for $V_{CONTROL}$. The varactors 420-1 and 420-2 are symmetrically laid out on the wafer 100 so that they are mirror images of each other. To provide symmetry, the test structure 410 may include a pair of substructures, substructure 410-1 between points E and F and substructure 410-2 between points F and G in the LC oscillator circuit 400. The substructures 410-1 and 410-2 are also laid out on the wafer 100 so that they are mirror images of each other. The test structure 410 and the pair of varactors 420-1 and 420-2 form an LC tank of the LC oscillator circuit.

The LC oscillator circuit 400 further includes a pair of cross-coupled p-type transistors $M_{P1}$ and $M_{P2}$ and a pair of cross-coupled n-type transistors $M_{N1}$ and $M_{N2}$, which are configured to overcome the losses in the LC tank contributed by resistances associated with the test structure 410 and the varactors 420-1 and 420-2. The LC oscillator circuit 400 further includes a bias current source $I_{BIAS}$. The bias current source $I_{BIAS}$ can be a voltage controlled N-MOS transistor that is used to set up a DC operation point (about 5 mA) in the LC oscillator circuit 400. In one embodiment of the present invention, the p-type transistors and n-type transistors thus coupled contribute a negative resistance $$R_n = -\frac{2}{G_{M_N} + G_{M_P}}, \tag{1}$$

where $G_{M_N}$ is an impedance between a source and a drain of one of the N-type transistors $M_{N1}$ and $M_{N2}$, and $G_{M_P}$ is an impedance between a source and a drain of one of the P-type transistors $M_{P1}$ and $M_{P2}$. $G_{M_N}$ and $G_{M_P}$ can be tuned so that the negative resistance $R_n$ cancels an equivalent parallel resistance $R_p$ of the LC tank.

To tune the transistors $M_{N1}$, $M_{N2}$, $M_{P1}$, and $M_{P2}$, circuit simulations are performed after the layout of other parts of the LC oscillator circuit is determined. A conventional circuit simulator can be used to carry out the simulations. During the simulations, the lengths and widths of the transistors $M_{N1}$, $M_{N2}$, $M_{P1}$, and $M_{P2}$ are varied until a stable and lossless oscillation can be obtained in the LC tank. These values of the lengths and widths of the transistors $M_{N1}$, $M_{N2}$, $M_{P1}$, and $M_{P2}$, at which a stable and lossless oscillation is obtained in the LC oscillator circuit tank, are used to layout the transistors $M_{N1}$, $M_{N2}$, $M_{P1}$, and $M_{P2}$ on the substrate 100.

Figure 4A:
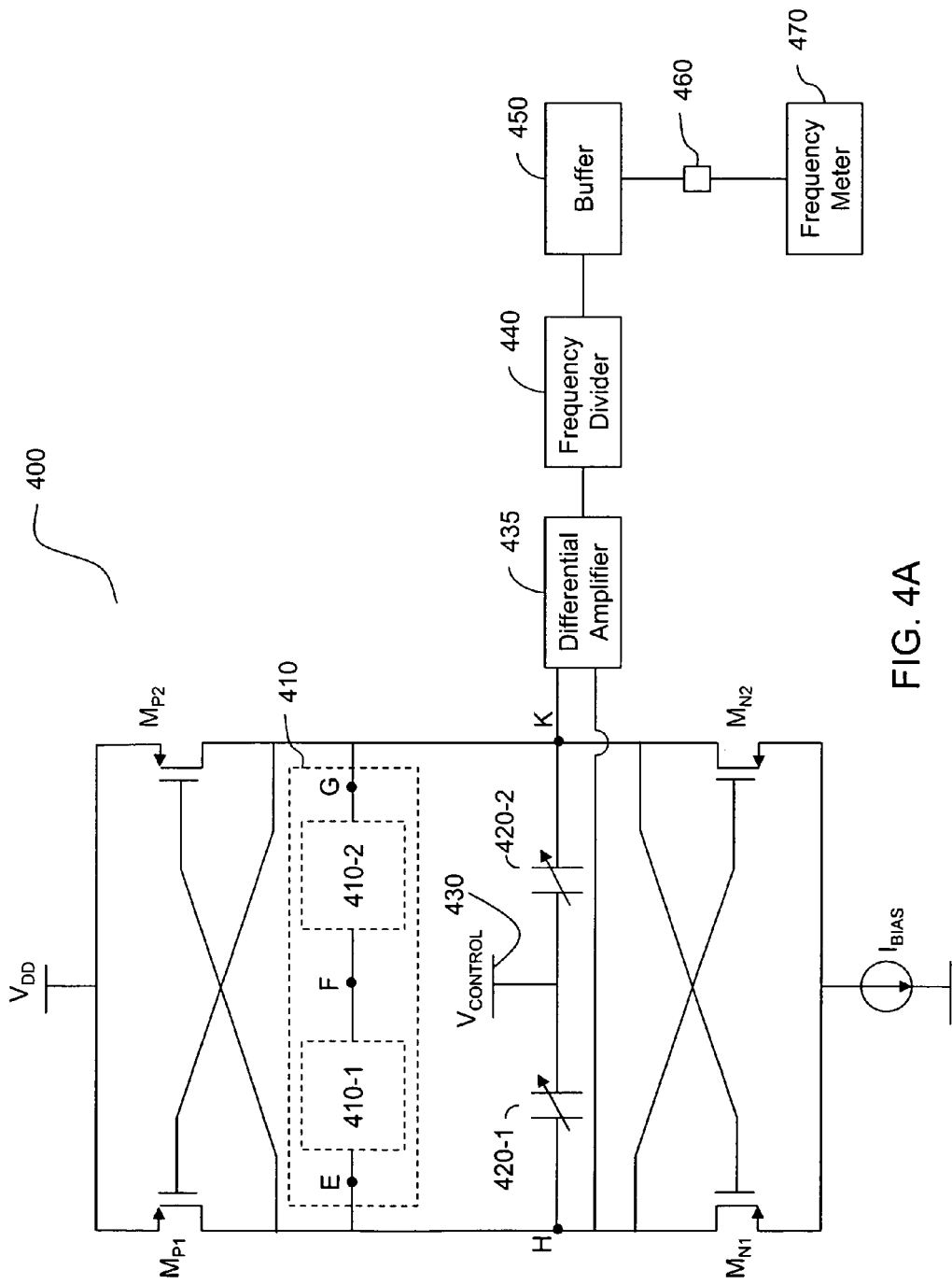
FIG. 4A is a circuit schematic of a first test chip for measuring the parasitic inductance associated with the subcircuit according to one embodiment of the present invention.
Figure 4B:
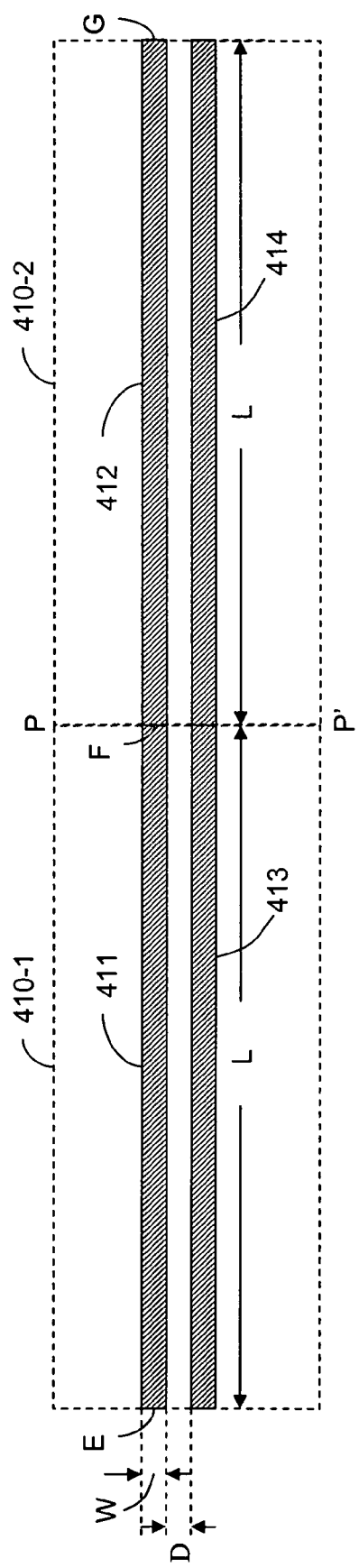
FIGS. 4B–4D are layouts illustrating examples of a test structure in the first test chip.

Each of varactors 420-1 and 420-2 can be any conventional varactor structure that provides a good tuning range for a capacitance $C_v$ between the two terminals of the varactor. In one embodiment of the present invention, the capacitance $C_v$ should be tunable between a minimum capacitance $C_{min}$ and a maximum capacitance $C_{max}$. It is preferred that $C_{max}$ is at least about two times the minimum capacitance $C_{min}$, i.e., $C_{max} \geq 2 \times C_{min}$. FIG. 5A illustrates a cross-sectional view of a varactor structure 500 that can be used in varactor 420-1 or 420-2 according to one embodiment of the present invention. As shown in FIG. 5A, varactor structure 500 includes a N-well or P-well (well) 510 formed in the substrate 100, a pair of well contacts 520 formed in the well 510 and having the same conductivity type as the well, a dielectric layer 540 formed over the well, and a conductive gate 550 formed over the dielectric layer 540. The conductive gate 550 is connected to the pad for $V_{CONTROL}$ in the LC oscillator circuit 400, while the well contacts 520 are connected to another terminal D of the varactor 420-1 or 420-2, which is connected to point H or K, respectively, in the LC oscillator circuit 400 shown in FIG. 4. Varactor structure 500 may also include a pair of shallow trench isolations (STI) 530 between the gate 550 and the well contacts 520 to reduce parasitic capacitances and increase the tuning range of the capacitance $C_V$ between the pad for $V_{CONTROL}$ and terminal D.

Figure 5A:
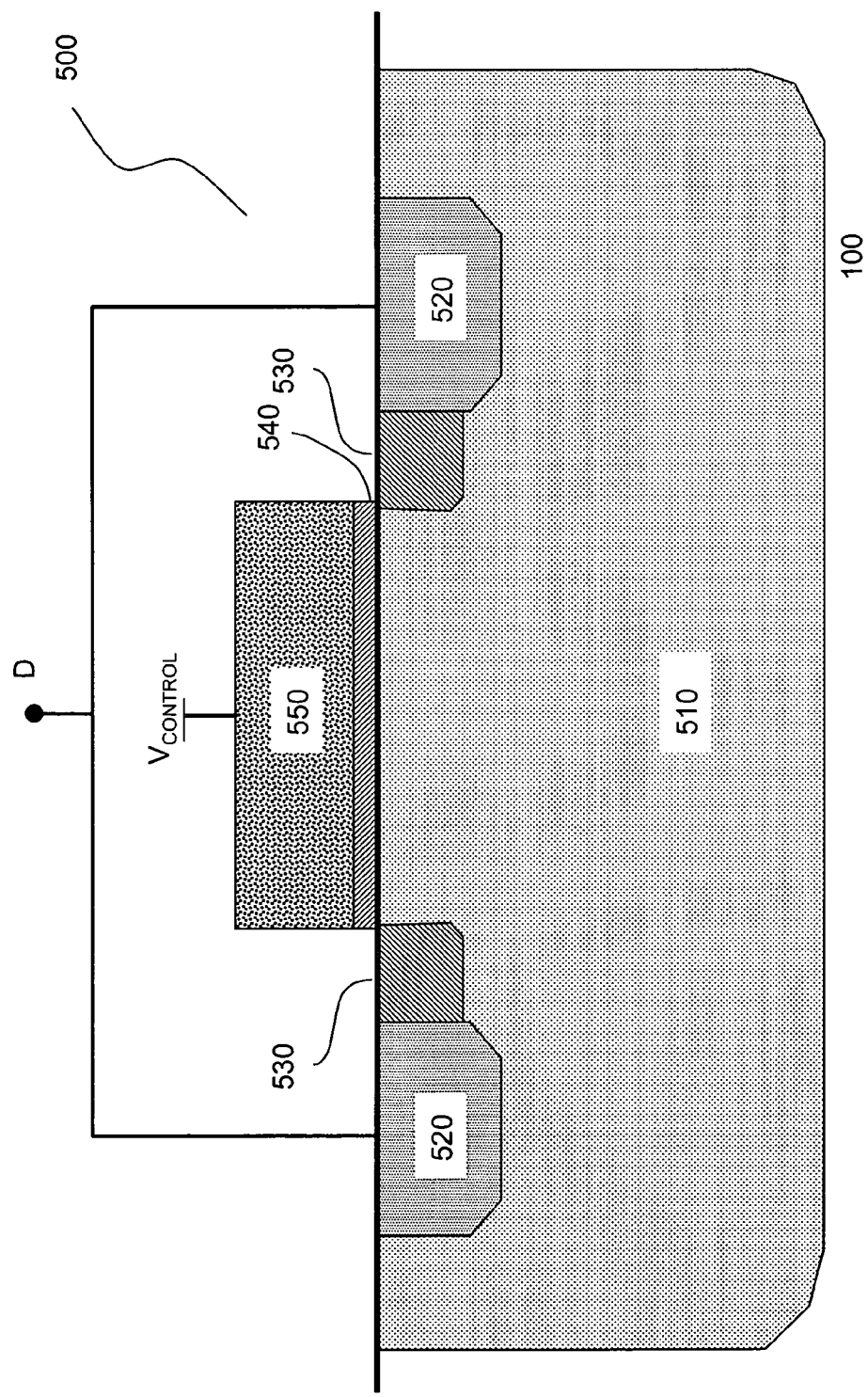
FIG. 5A is a block diagram illustrating a varactor in the first test chip according to one embodiment of the present invention.
Figure 5B:
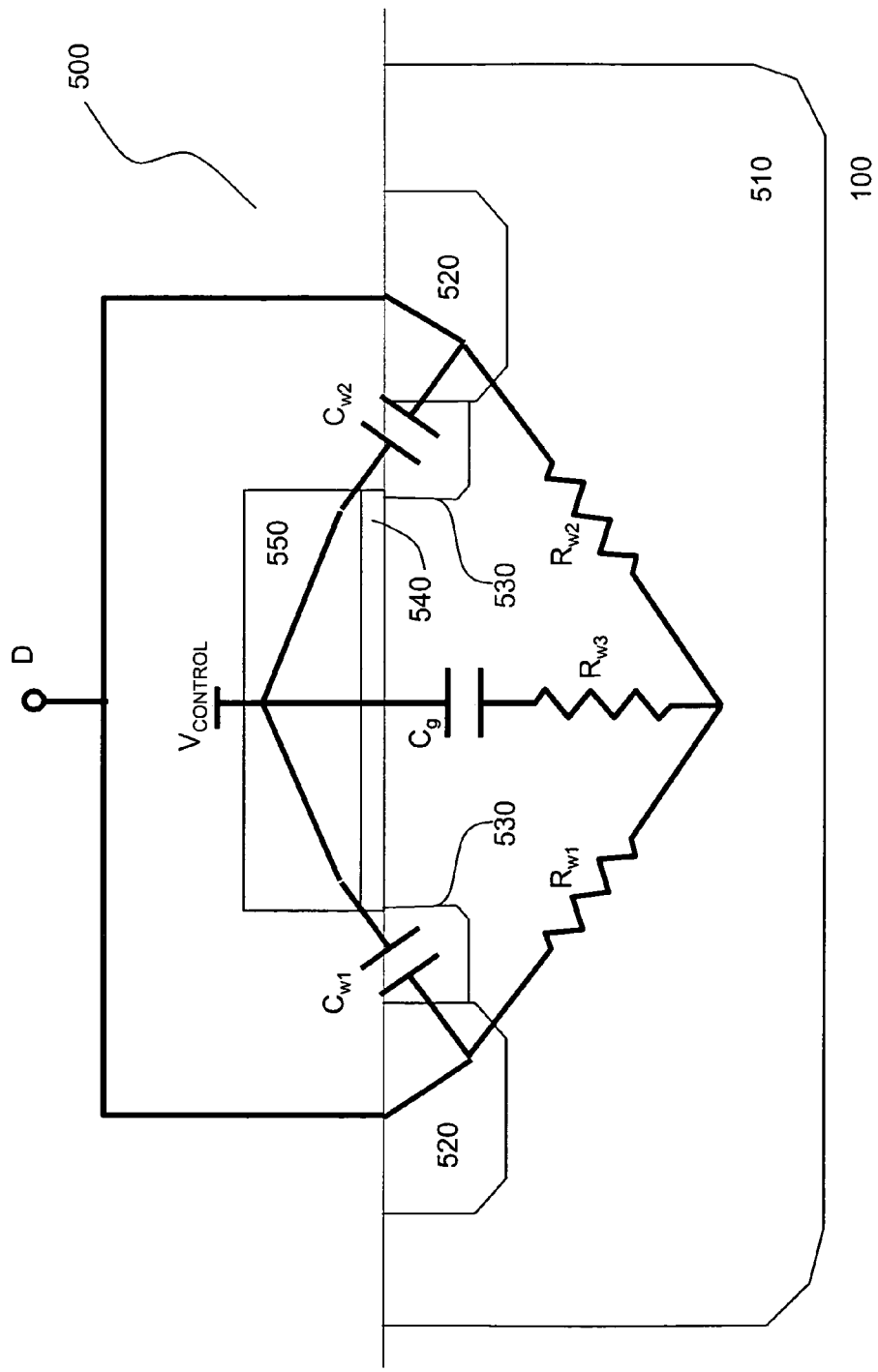
FIG. 5B is a circuit schematic illustrating an equivalent circuit of the varactor.

FIG. 5B illustrates an equivalent circuit diagram of the varactor structure 500. As shown in FIG. 5B, the varactor capacitance $C_V$ is dependent on the capacitances $C_{w1}$ and $C_{w2}$ between the conductive gate 550 and the well contacts 520. $C_V$ can be tuned by controlling $V_{CONTROL}$ applied to the gate 550, while an alternating signal is applied to the well contacts 520. As shown in FIG. 5B, varactor structure 500 also includes parasitic resistances, $R_{w1}$, $R_{w2}$, $R_{w3}$ associated with the well 510.

A separate test chip 370 including a varactor structure substantially identical to the varactor structure 500 may be built in the test areas 120 on the wafer 100 for characterizing the varactor 500, so that a curve of the capacitance $C_V$ of the varactor 500 as a function of the voltage $V_{CONTROL}$ can be obtained using an on-chip capacitance measurement technique. In one embodiment of the present invention, the technique discussed by Chen, et al. supra, which is incorporated herein by reference, is used to obtain the $C_V$-$V_{CONTROL}$ curve. In an alternative embodiment, a technique as described in commonly owned patent application entitled "A Circuit and Method for Measuring the Capacitance of a Nonlinear Device," Ser. No. 10/759,405, which is incorporated herein by reference, is used to obtain the $C_V$-$V_{CONTROL}$ curve. The $C_V$-$V_{CONTROL}$ curve will be used to determine the parasitic inductance of the subcircuit 200, as described in more detail below.

In one embodiment of the present invention, each of the substructures 410-1 and 410-2 resembles the subcircuit 200 in that it includes at least one circuit element having a same layout on the substrate 100 as a circuit element in the subcircuit 200, which contributes the parasitic inductance $L_p$. For example, as shown in FIG. 2C and FIG. 4B, if the subcircuit 200 includes sections of interconnect lines 211 and 213, substructures 410-1 and 410-2 also includes the interconnect lines 411 and 412 each corresponding to and having the same layout (i.e., the same width, W, and length, L) as interconnect line 211. Substructures 410-1 and 410-2 may also include interconnect lines 413 and 414 each corresponding to and having substantially the same layout as interconnect line 213. If the substructures 410-1 and 410-2 include interconnect lines 411 and 412 and do not include interconnect lines 413 and 414, substructures 410-1 and 410-2 can be used to determine the self inductance of the interconnect line 211 in the subcircuit 200. If the substructures 410-1 and 410-2 include the interconnect lines 411 and 412 and interconnect lines 413 and 414, substructures 410-1 and 410-2 can be used to determine the mutual inductance between interconnect lines 211 and 213 in the subcircuit 200. As shown in FIG. 4B, substructures 410-1 and 410-2 are laid out such that they are connected at point F and are mirror images to each other with respect to a virtual place P–P' between them.

Figure 4C:
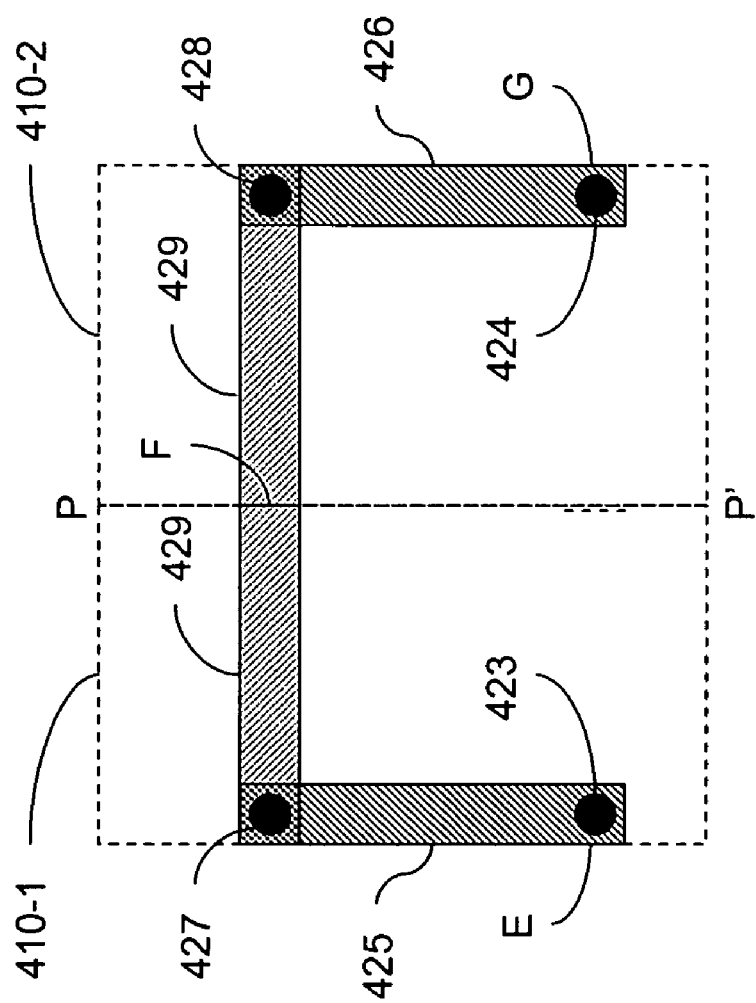

FIG. 4C illustrates another example of the substructures 410-1 and 410-2 that can be used to determine the parasitic inductance associated with the subcircuit 200 shown in FIG. 2D. As shown in FIG. 4C, substructures 410-1 and 410-2 include vias 423 and 424 each corresponding to and having substantially the same layout as the via 223 in the subcircuit 200 shown in FIG. 2D. Substructures 410-1 and 410-2 further include vias 427 and 428 each corresponding to and having substantially the same layout as the via 227 shown in FIG. 2D, and interconnect lines 425 and 426 each corresponding to and having substantially the same layout as the interconnect line 225. The substructures 410-1 and 410-2 shown in FIG. 4C can thus be used to determine the parasitic inductance between terminals A and B of the subcircuit 200 shown in FIG. 2D. As shown in FIG. 4C, substructures 410-1 and 410-2 are laid out such that they are connected at point F and are mirror images of each other with respect to a virtual plane P–P' between them.

Figure 4D:
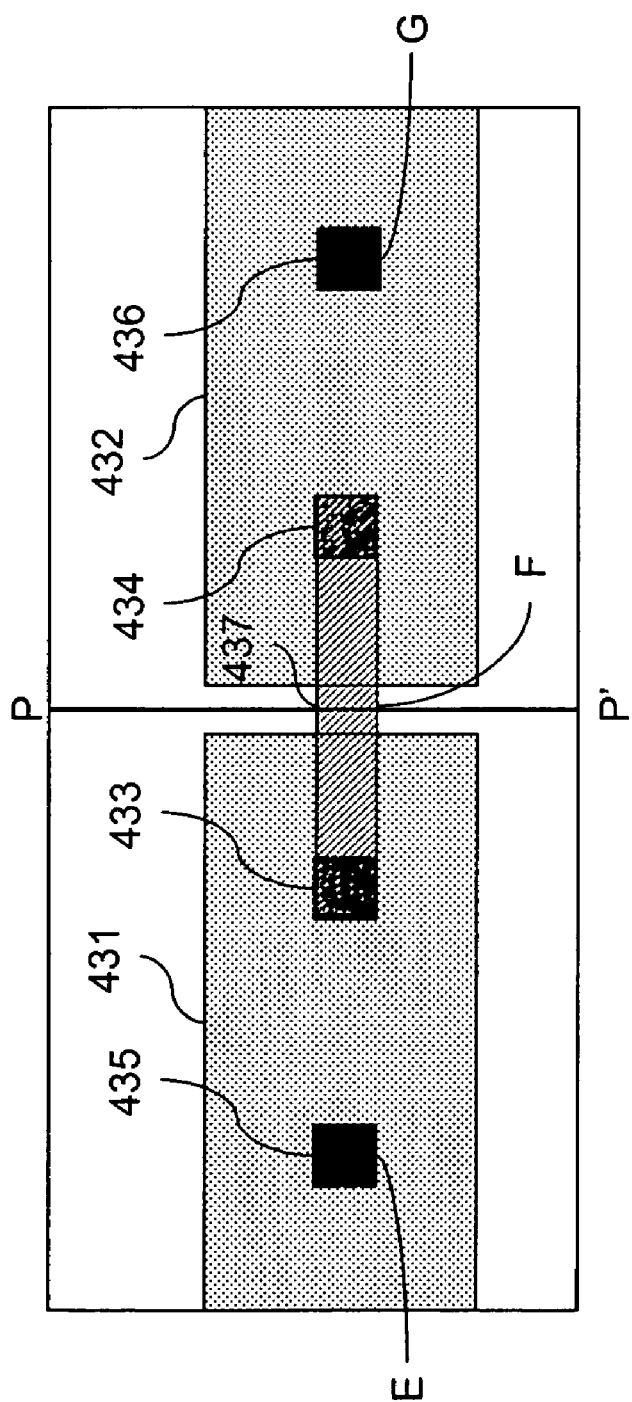

FIG. 4D illustrates yet another example of the substructures 410-1 and 410-2 that can be used to determine the parasitic inductance associated with the subcircuit 200 shown in FIG. 2E. As shown in FIG. 4D, substructures 410-1 and 410-2 include diffusions 431 and 432 each corresponding to and having substantially the same layout as the diffusion 231 in the subcircuit 200 shown in FIG. 2E, contacts 433 and 434 each corresponding to and having substantially the same layout as the contact 233 shown in FIG. 2E, and contacts 435 and 436 each corresponding to and having substantially the same layout as the contact 235 in the subcircuit 200 shown in FIG. 2E. The substructures 410-1 and 410-2 shown in FIG. 4D can thus be used to determine the parasitic inductance between terminals A and B of the subcircuit 200 shown in FIG. 2E. As shown in FIG. 4D, substructures 410-1 and 410-2 are laid out such that they are connected at point F by an interconnect line 437 and are mirror images of each other with respect to a virtual place P—P' between them.

Figure 6:
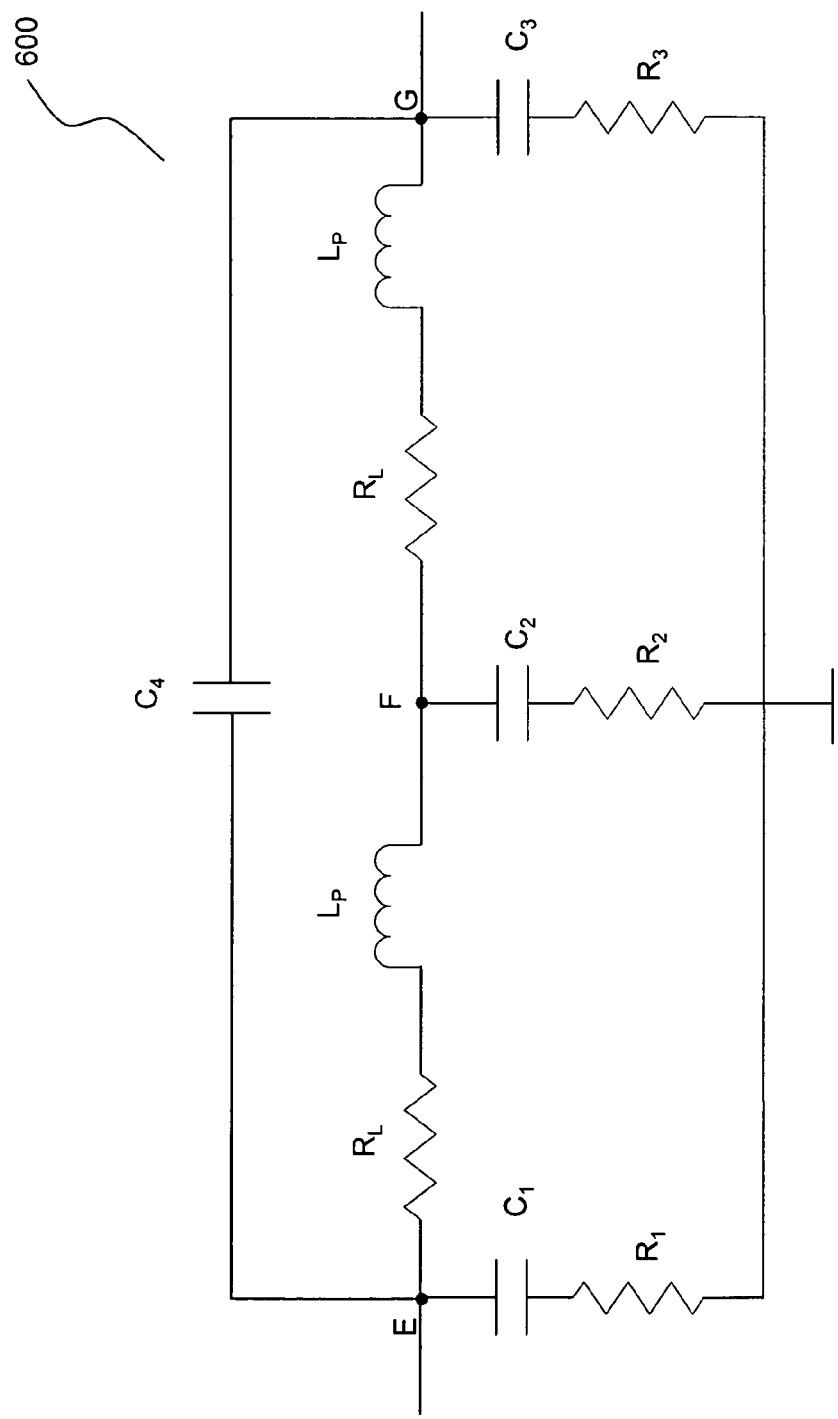
FIG. 6 is a circuit schematic illustrating an equivalent circuit of the test structure in the first test chip according to one embodiment of the present invention.

In most cases, substructures 410-1 and 410-2 can be regarded as being equivalent to a double-π circuit. As shown in FIG. 6, the double-π circuit 600 includes a parasitic inductance $L_p$ and an associated resistance $R_L$ between points E and F and between points F and G, corresponding to each of the pair of sub-structures 410-1 and 410-2. In the examples shown in FIGS. 4C and 4D, there may also be a parasitic capacitance $C_4$ between points E and G. For the example shown in FIG. 4C, the parasitic capacitance $C_4$ corresponds to the parasitic capacitance between interconnect lines 425 and 426. For the example shown in FIG. 4D, the parasitic capacitance $C_4$ corresponds to the parasitic capacitance between diffusions 431 and 432. For the example shown in FIG. 4B, the parasitic capacitance $C_4$ may not need to be included. Because test structure 410 is fabricated on substrate 100, the double r circuit 600 may further include parasitic capacitances $C_1$, $C_2$, and $C_3$ and associated parasitic resistances $R_1$, $R_2$, and $R_3$, respectively, between points E, F, and G, respectively, to ground. Although the double π circuit 600 is used here to describe an embodiment of the present invention, the present invention is not limited to what the equivalent circuit of the test structure 410 is like and can be used to measure the parasitic inductance of many different kinds of subcircuits.

After an equivalent circuit for the test structure 400 is determined, circuit simulations can be used to determine a relationship between a center frequency f of the LC oscillator circuit 400 and the circuit components in the LC oscillator circuit 400. Again, a conventional circuit simulator can be used for this purpose. During the simulation, a relationship between a center frequency f of the LC oscillator circuit 400 and the inductances and capacitances in the LC tank is derived. The relationship may come in the form of::

$$f=f(L_p, C_v, C_1, C_2, C_3, C_4), \quad (2)$$

So, when $C_V$ is tuned so that a stable oscillation is generated in the LC oscillator circuit 400, the parasitic inductance $L_p$ can be determined by measuring the oscillation frequency f, if the parasitic capacitances $C_1$, $C_2$, $C_3$, and $C_4$ of the test structure 410 are known. The test structure 400 can be used to measure any subcircuit 200 having an $L_p$ as small as 1 pH with a resolution of about 0.01 pH.

Figure 7:
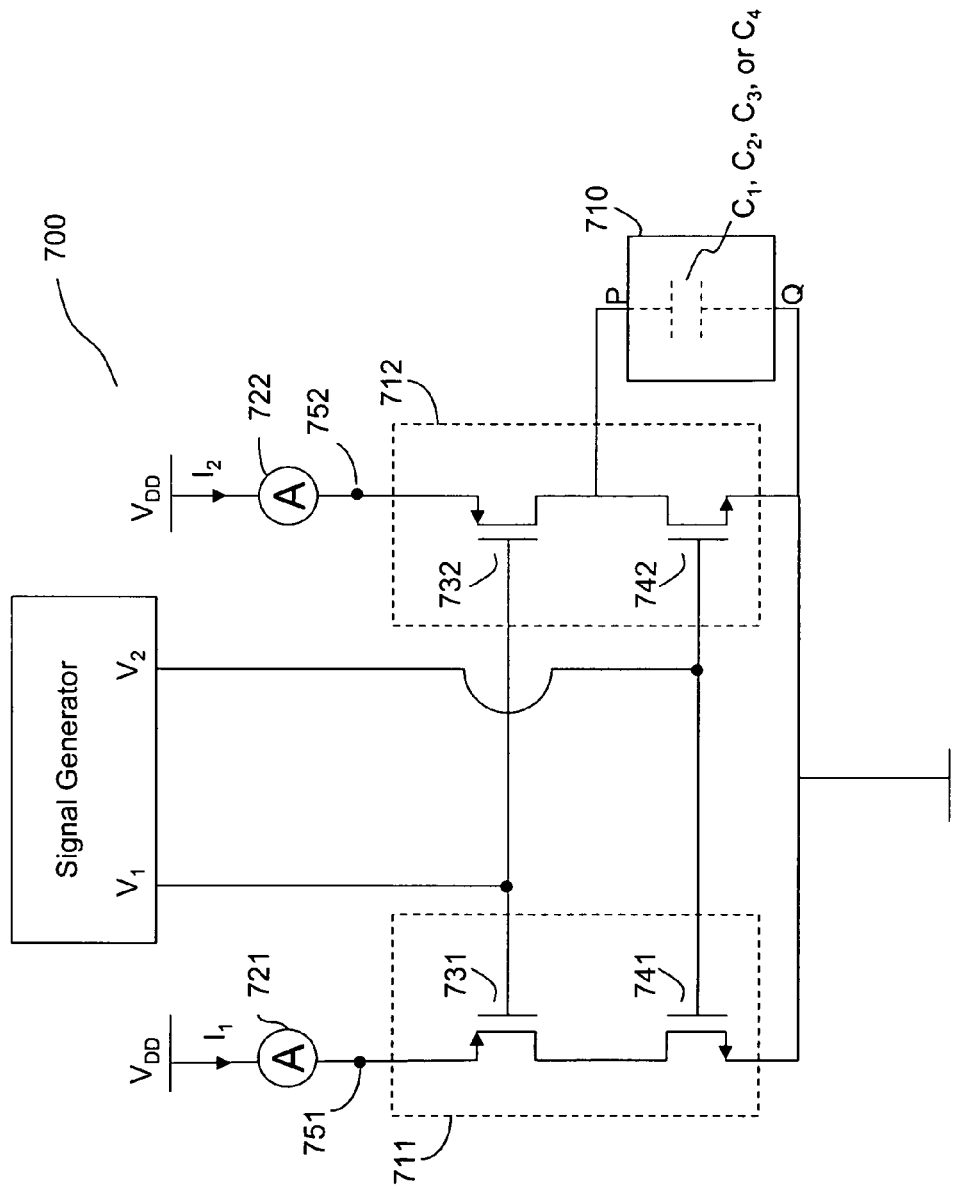
FIG. 7 is a circuit schematic illustrating a second test chip in a test area on the semiconductor wafer for measuring parasitic capacitance in the test structure in the first test chip.

The parasitic capacitance $C_1$, $C_2$, $C_3$, or $C_4$ of the test structure 410 can be measured using one of the test chips 350 on the wafer 100 shown in FIG. 3. Any conventional test structure for on-chip capacitance measurement can be used in test chip 350. FIG. 7 illustrates an equivalent circuit for a test structure 700 that can be used in test chip 350, according to one embodiment of the present invention. As shown in FIG. 7, test structure 700 includes a pair of pseudo inverters 711 and 712. Pseudo inverter 711 includes a PMOS transistor 731 and a NMOS transistor 741 having their drains connected to each other. The source of the PMOS transistor 731 is connected to a pad 751, which is for connecting to a power supply $V_{DD}$ through a DC ammeter 721. The source terminal of the NMOS transistor 741 is coupled to a circuit ground.

Similarly, pseudo inverter 712 also includes a PMOS transistor 732 and a NMOS transistor 742 having their drains connected to each other. The source of the PMOS transistor 732 is connected to a pad 752, which is for connecting to a power supply $V_{DD}$ through a DC ammeter 722. The source terminal of the NMOS transistor 742 is coupled to the circuit ground. Also attached between the drain terminal P of the second pseudo inverter 712 and a ground terminal Q of the test structure 700 is a structure 710 having a same layout as the structure 410-1, 410-2, or 410 and connected to the terminals P and Q so that the capacitance of the structure 710 between terminals P and Q is equal to the parasitic capacitance C1, C2, C3, or C4 of the structure 410.

Figure 8:
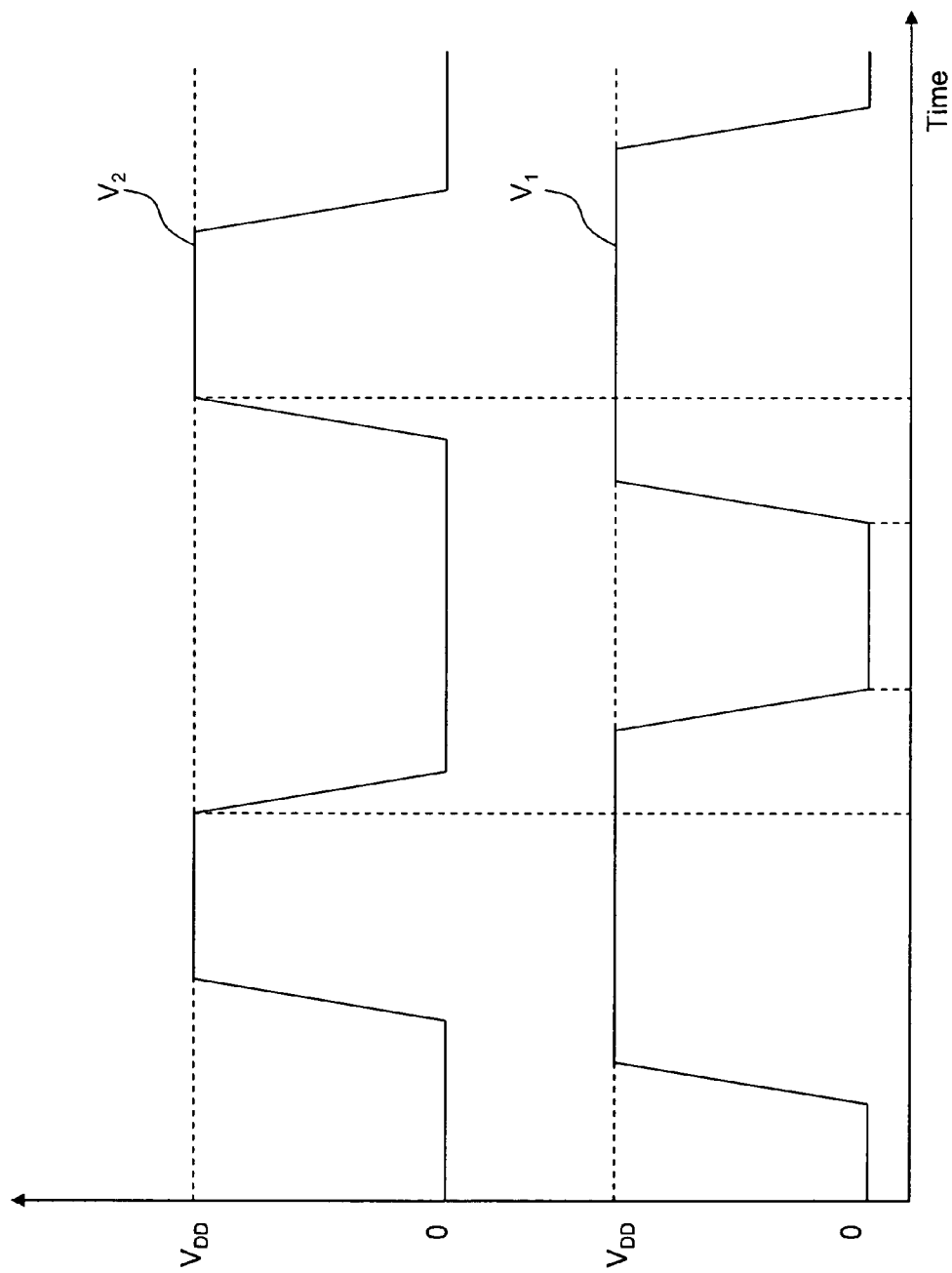
FIG. 8 sets forth plots of two control voltage signals applied to the second test chip for measuring parasitic capacitance in the test structure in the first test chip.

In order to measure the parasitic capacitance C1, C2, C3, or C4 in the structure 410, a first voltage control signal $V_1$ is applied to the gates of the PMOS transistors 731 and 732 and a second voltage control signal $V_2$ is applied to gates of the NMOS transistors 741 and 742. As shown in FIG. 8, the first voltage control signal $V_1$ and the second voltage control signal $V_2$ are designed such that the NMOS transistors are turned on at times when the PMOS transistors are turned off and the PMOS transistors are turned on at times when the NMOS transistors are turned off. Thus, the first voltage control signal $V_1$ and the second voltage control signal $V_2$ allow the parasitic capacitance C1, C2, C3, or C4 of the structure 710 to be charged and discharged in alternate cycles of the control signals. The ammeters 721 and 722 measure average DC currents $I_1$ and $I_2$ flowing through pseudo inverters 711 and 712, respectively. This way the capacitance C1, C2, C3, or C4 can be determined by $$C_i = \frac{|I_1 - I_2|}{V_{DD} f_v}, \qquad (4)$$

where i=1, 2, 3, or 4, and $f_v$ is the frequency of the first or second voltage control signal $V_1$ or $V_2$.

Test chips 300 and 350 can be fabricated using conventional integrated circuit fabrication techniques and are fabricated together with the plurality of integrated circuits 110-1, 110-2, etc., on the substrate 100. In one embodiment of the present invention, test chip 300 is laid out on the wafer 100 symmetrically so that a half of the test chip 300 is a mirror image to another half of the test chip 300. Test chip 350 is laid out on the wafer 100 such that pseudo inverter 711 is a mirror image of pseudo inverter 712. Although FIG. 3 only shows one test chip 300 and several test chips 350, in practice, there can be many such test chips in the test area 120 on the wafer 100 for measuring different subcircuits in different ICs on the wafer 100.

Figure 9:
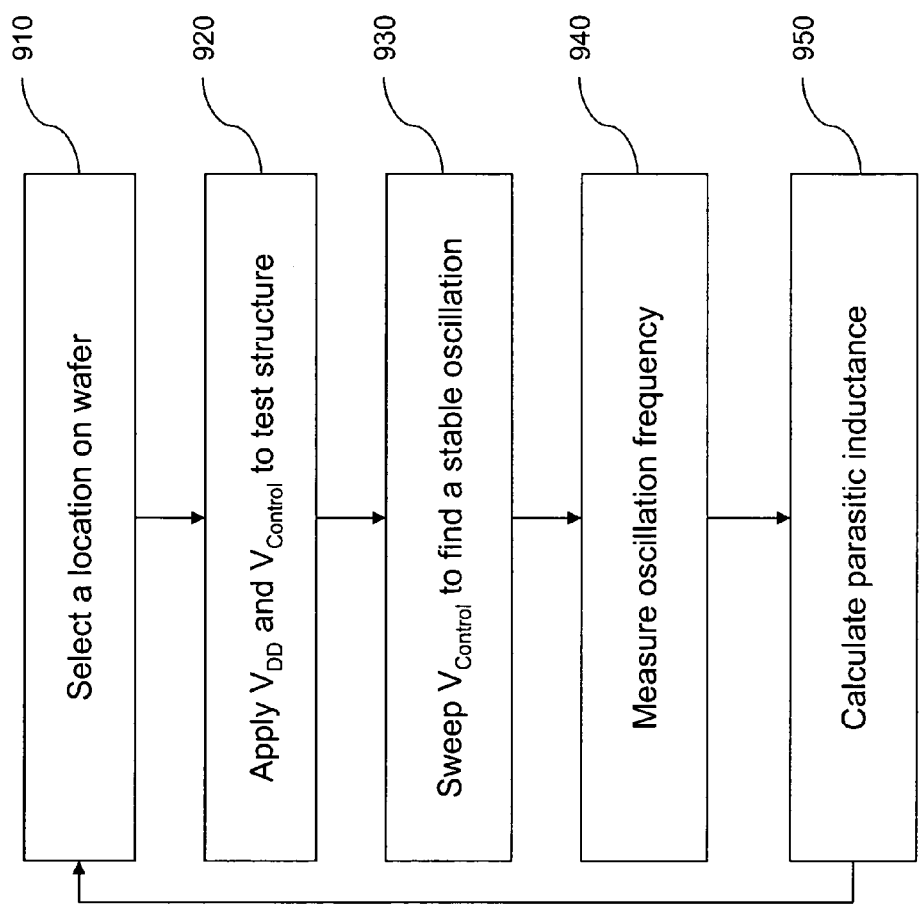
FIG. 9 is a flowchart illustrating a method for measuring parasitic inductance associated with the subcircuit according to one embodiment of the present invention.

FIG. 9 illustrates a method 900 for measuring the parasitic inductance of subcircuit 200 using test chip 300 and 350 according to one embodiment of the present invention. As shown in FIG. 9, method 900 includes step 910 in which test chip 300 is selected among the many test chips on the wafer 100, and step 920 in which the power supply for $V_{DD}$ and that for $V_{CONTROL}$ is connected to the test chip 300 as shown in FIG. 4. Method 900 further includes step 930 in which $V_{CONTROL}$ is swept across a range of voltage values until a stable oscillation is detected in the LC oscillator circuit 400 using conventional oscillation detection means.

As shown in FIG. 4A, to facilitate detection of the oscillations in the LC oscillator circuit 400, the LC oscillator circuit 400 is connected to a pad 460 on the substrate 100 through a conventional differential amplifier circuit 435, a conventional frequency divider circuit 440 and a conventional buffer circuit 450. A conventional frequency meter 470 is connected to the pad 460 to measure the frequency of the oscillations. The differential amplifier circuit 435 has two inputs coupled to the H and K points, respectively, of the LC oscillator circuit 400, and an output coupled to the frequency divider circuit 440. There is usually an equivalent capacitance between each input and the ground in the differential amplifier circuit 435, which acts as a load capacitance (about 0.2 nF to about 1.0 nF) between the H or K point and the ground for the LC oscillator circuit 400. The frequency divider circuit 440 divides the frequency of the oscillation and the buffer circuit 450 amplifies the oscillation signal so that it is easier for the frequency meter 470 to detect and measure the oscillation frequency.

Method 900 further includes step 940 in which the oscillation frequency is measured using the frequency meter 370, and step 950 in which the parasitic inductance is calculated according to Equation (2). Prior to the performance of step 950, C1, C2, C3, and C4 (if needed) are measured using test chips 350 as discussed above, and the value of $V_{CONTROL}$ at which the stable oscillation is detected is used to determine the capacitance $C_V$ of the varactor 420-1 or 420-2 based on the $C_V$-$V_{CONTROL}$ curve obtained using test structure 370, as discussed above.

The foregoing description, for purpose of explanation, has been described with reference to specific embodiments. However, the illustrative discussions above are not intended to be exhaustive or to limit the invention to the precise forms disclosed. One skilled in the relevant art will recognize that there are many possible modifications of the disclosed embodiments that could be used, while still employing the same basic underlying mechanisms and methodologies. For example, the P-type transistors and N-type transistors of FIG. 4 may be implemented with different types of transistors, such as FET transistors and MOS transistors. In addition, test structure 410 does not have to include a pair of substantially identical substructures. It could just be a structure substantially identical to the subcircuit 200 for which parasitic inductance is to be measured. The embodiments were chosen and described in order to best explain the principles of the invention and its practical applications, to thereby enable others skilled in the art to best utilize the invention and various embodiments with various modifications as are suited to the particular use contemplated.

We claim:

1. A test structure in a test area of a semiconductor substrate for measuring a parasitic inductance in an integrated circuit fabricated on the semiconductor substrate, comprising:
   an LC oscillator circuit;
   at least one substructure in the LC oscillator circuit and including a circuit element having a same layout as a circuit element in the integrated circuit contributing the parasitic inductance; and
   at least one varactor having a capacitance adjustable by a control voltage source; and wherein when the varactor is adjusted to a certain capacitance value, a stable oscillation can be generated in the LC oscillator circuit, and a frequency of the oscillation is dependent on an inductance associated with the substructure, which is related to the parasitic inductance in the integrated circuit.

2. The test structure of claim 1 wherein the integrated circuit includes a first interconnect line and the substructure includes a second interconnect line having a same layout on the semiconductor wafer as the first interconnect line.

3. The test structure of claim 1 wherein the integrated circuit includes a first via and the substructure includes a second via having a same layout on the semiconductor wafer as the first via.

4. The test structure of claim 1 wherein the integrated circuit includes a first diffusion region and the substructure includes a second diffusion region having a same layout on the semiconductor wafer as the first diffusion region.

5. The test structure of claim 1 wherein the substructure is one of a pair of substructures that are laid out on the semiconductor wafer such that they are mirror images of each other.

6. The test structure of claim 5 wherein the varactor is one of a pair of varactors that are laid out on the semiconductor wafer such that they are mirror images of each other.

7. The test structure of claim 6 wherein the pair of substructures and the pair of varactors together form an LC tank of the LC oscillator circuit.

8. The test structure of claim 7, further comprising a pair of P-type transistors and a pair of N-type transistors that are part of the LC oscillator circuit.

9. The test structure of claim 8, wherein the P-type transistors and N-type transistors together contribute a negative resistance that cancels an equivalent parallel resistance of the LC tank.

10. The test structure of claim 1 wherein the LC oscillator circuit is laid out symmetrically on the semiconductor substrate such that one half of it is a mirror image of another half.

11. The test structure of claim 1, further comprising:
a frequency divider connected to the LC oscillator circuit.

12. The test structure of claim 11, further comprising:
a buffer connected to the frequency divider; and
a pad connected to the buffer for connecting the test structure to a frequency meter.

13. A method for measuring a parasitic inductance in an integrated circuit fabricated on a semiconductor substrate, comprising:
selecting a test chip on the semiconductor substrate, the test chip including a circuit element having a same layout as a circuit element in the integrated circuit that contributes the parasitic inductance;
applying a control voltage to the test chip and adjusting the control voltage until a stable oscillation is generated in the test chip;
measuring a frequency of the oscillation; and
determining the parasitic inductance using the frequency.

14. The method of claim 13 wherein the test chip includes an LC oscillator circuit and determining the parasitic inductance using the frequency comprises:
deriving a relationship between the frequency and capacitances and inductances in the LC oscillator circuit;
determining the values of the capacitances; and
determining the parasitic inductance based on the relationship and the values of the capacitances.

15. The method of claim 14 wherein deriving a relationship between the frequency and capacitances and inductances in the LC oscillator circuit comprises simulating the LC oscillator circuit to obtain the relationship.

16. The method of claim 14 wherein the LC oscillator circuit includes at least one varactor and determining the values of the capacitances comprises determining the capacitance of the varactor based on the control voltage at which the stable oscillation is generated in the test chip.

17. The method of claim 14 wherein determining the values of the capacitance comprises measuring parasitic capacitances in the LC oscillator circuit.

18. A test structure in a test area adjacent at least one integrated circuit on a semiconductor wafer, the test structure comprising an LC oscillator circuit having an oscillation frequency related to a parasitic inductance associated with a subcircuit in the at least one integrated circuit.

19. The test structure of claim 18 wherein the test structure further comprises at least one substructure in the LC oscillator circuit, the substructure having a same layout as the subcircuit having the parasitic inductance.

20. The test structure of claim 18 wherein the test structure further comprises at least one varactor having an adjustable capacitance related to the oscillation frequency.

21. A test structure in a test area of a semiconductor substrate for measuring a parasitic inductance in an integrated circuit fabricated on the semiconductor substrate, comprising:
an LC oscillator circuit having an oscillation frequency related to the parasitic inductance; and
at least one substructure in the LC oscillator circuit including a circuit element having a same layout as a circuit element in the integrated circuit having the parasitic inductance.

22. The test structure of claim 21 further comprising at least one varactor having a capacitance adjustable by a control voltage source.

* * * * *